US010243465B1

United States Patent
Young

(10) Patent No.: US 10,243,465 B1
(45) Date of Patent: Mar. 26, 2019

(54) SELF-STABILIZED CONSTANT ON-TIME CONTROL

(71) Applicant: Alpha and Omega Semiconductor (Cayman) Limited, Grand Cayman (KY)

(72) Inventor: Chris M. Young, Round Rock, TX (US)

(73) Assignee: Alpha and Omega Semiconductor (Cayman) Limited, Grand Cayman (KY)

( * ) Notice: Subject to any disclaimer, the term of this patent is extended or adjusted under 35 U.S.C. 154(b) by 0 days.

(21) Appl. No.: 16/038,018

(22) Filed: Jul. 17, 2018

Related U.S. Application Data

(60) Provisional application No. 62/642,717, filed on Mar. 14, 2018.

(51) Int. Cl.
*H02M 3/335* (2006.01)
*H02M 3/158* (2006.01)

(52) U.S. Cl.
CPC ......... *H02M 3/1582* (2013.01); *H02M 3/158* (2013.01); *H02M 3/335* (2013.01); *H02M 3/33507* (2013.01)

(58) Field of Classification Search
CPC .... H02M 3/158; H02M 3/335; H02M 3/1585; H02M 3/33507
See application file for complete search history.

(56) References Cited

U.S. PATENT DOCUMENTS

| 5,668,708 | A | * | 9/1997 | Scapellati | H02M 1/14 363/46 |
| 5,929,692 | A | | 7/1999 | Carsten | |
| 6,495,995 | B2 | * | 12/2002 | Groom | H02M 3/1584 323/283 |
| 6,522,108 | B2 | | 2/2003 | Prager et al. | |
| 8,575,910 | B2 | | 11/2013 | Young | |
| 2003/0218893 | A1 | * | 11/2003 | Tai | H02M 3/1584 363/65 |
| 2013/0279216 | A1 | * | 10/2013 | Nguyen | H02M 1/14 363/41 |
| 2014/0125306 | A1 | | 5/2014 | Babazadeh et al. | |

* cited by examiner

*Primary Examiner* — Timothy J Dole
*Assistant Examiner* — Ishrat Jamali
(74) *Attorney, Agent, or Firm* — Craige Thompson; Thompson Patent Law

(57) ABSTRACT

Some apparatus and associated methods relate to a buck-derived switched mode power supply with constant on-time and configured to substantially maintain a steady-state average switch period in a time interval between a start of a load transient and the time when the inductor current returns to a steady state. In an illustrative example, the time interval may include a first and a second predetermined number of cycles after the start of the load transient. The switch period may be modulated, for example, by an amount calculated to supply a change in additional energy demand in the first number of cycles and an opposite amount in the subsequent second number of cycles calculated to maintain the average steady-state switch period over the time interval. In various examples, maintaining average switching period with constant on-time may minimize transient response times without sacrificing stability and without the need for complex compensation networks.

20 Claims, 5 Drawing Sheets

US 10,243,465 B1

SELF-STABILIZED CONSTANT ON-TIME CONTROL

CROSS-REFERENCE TO RELATED APPLICATIONS

This application claims the benefit of U.S. Provisional Application Ser. No. 62/642,717 titled "Buck-Derived Switching Power Supply Techniques," filed by Chris M. Young on Mar. 14, 2018.

This application incorporates the entire contents of the foregoing application(s) herein by reference.

TECHNICAL FIELD

Various embodiments relate generally to components and methods for switch-mode power supplies.

BACKGROUND

Electronic devices receive power in a variety of ways. For example, consumer electronic devices may receive power from a wall outlet (e.g., mains) or from various portable sources (e.g., batteries, renewable energy sources, generators). Battery operated devices have an operational time that is dependent upon battery capacity and average current draw. Manufactures of battery powered devices may strive to reduce average battery current of their products in order to offer longer device use between battery replacement or between charge operations. In some examples, manufacturers of mains powered devices may strive to increase power efficiency of their products in order to minimize thermal loads and/or to maximize the performance per watt of power consumed.

In some electronic devices, an input voltage supply (e.g., battery input, rectified mains supply, intermediate DC supply) may be converted to a different voltage by various voltage conversion circuits. Switch-mode power supplies have gained popularity as voltage conversion circuits due to their high efficiency and therefore are often used in various electronic devices.

Switch-mode power supplies convert voltages using switching devices that turn on with very low resistance and turn off with very high resistance. Switch-mode power supplies may charge an output inductor during a period of time and may release part or all of the inductor energy during a subsequent period of time. The output energy may be delivered to a bank of output capacitors, which provide the filtering to produce a DC output voltage. In buck-derived switch-mode power supplies, the output voltage, in a steady state, may be approximately the input voltage times a duty cycle, where the duty cycle is the duration of the on-time of a pass switch divided by the total on-time and off-time of the pass switch for one switching cycle.

SUMMARY

Some apparatus and associated methods relate to a buck-derived switched mode power supply with constant on-time and configured to substantially maintain a steady-state average switch period in a time interval between a start of a load transient and the time when the inductor current returns to a steady state. In an illustrative example, the time interval may include a first and a second predetermined number of cycles after the start of the load transient. The switch period may be modulated, for example, by an amount calculated to supply a change in additional energy demand in the first number of cycles and an opposite amount in the subsequent second number of cycles calculated to maintain the average steady-state switch period over the time interval. In various examples, maintaining average switching period with constant on-time may minimize transient response times without sacrificing stability and without the need for complex compensation networks.

Some apparatus and associated methods relate to buck-derived switched mode power supplies configured to pulse current through an inductor in a steady-state mode with substantially constant pulse width and constant average switch period. In an illustrative example, a controller may modulate a switch off time by an amount calculated to supply the change in additional energy demand by the load. In response to a detected transient change in load demand, some implementations may calculate the modulation to achieve the new load demand in a predetermined first number of cycles, such as between one and three cycles, for example. The controller may, in some embodiments, oppositely modulate the switch off time for a second number of cycles and by an amount calculated to maintain an average switch off time over the first and second numbers of cycles. Various implementations may provide fast and stable response to load disturbances.

Various embodiments may achieve one or more advantages. For example, some buck-derived switch-mode power supplies employing a constant on-time constant average frequency method may improve power supply stability, especially during transient load events. In some instances, the buck-derived switch-mode power supplies employing a constant on-time constant average frequency method may substantially eliminate multi-pole compensation networks, which may reduce design time. Various buck-derived switch-mode power supplies employing a constant on-time constant average frequency method may produce output voltages that meet substantially stringent regulation requirements, for example.

The details of various embodiments are set forth in the accompanying drawings and the description below. Other features and advantages will be apparent from the description and drawings, and from the claims.

DETAILED DESCRIPTION OF ILLUSTRATIVE EMBODIMENTS

To aid understanding, this document is organized as follows. First, a representative computing product is briefly introduced as a dynamic load for a buck-derived DC-DC converter with reference to FIG. 1. Second, with reference to FIGS. 2A-5, various exemplary constant on-time constant average frequency buck-derived switch-mode power supplies and methods are explained.

Figure 1:
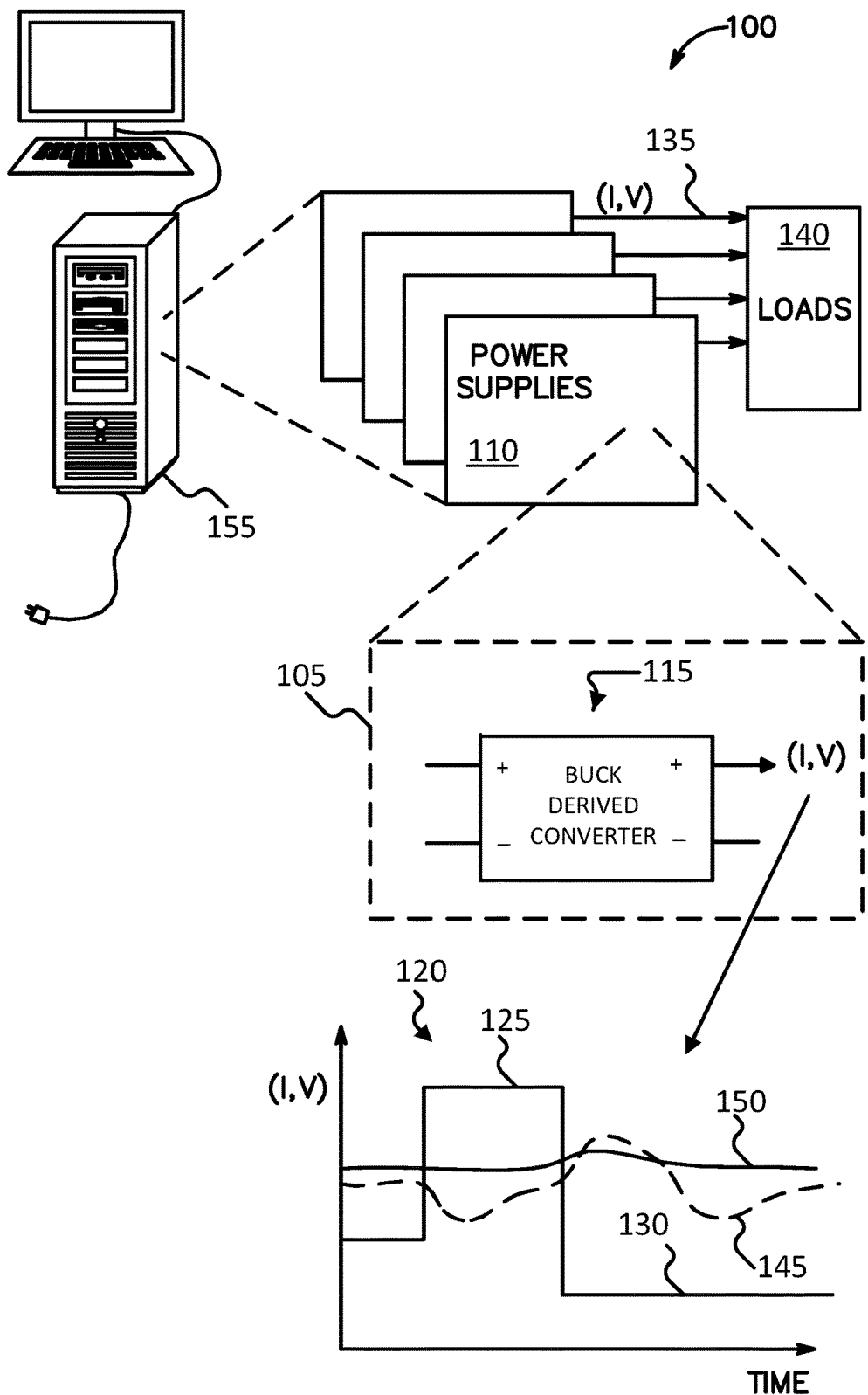
FIG. 1 depicts an exemplary DC-DC conversion scenario illustrating a transient load response in exemplary modes of operation of a buck-derived switch-mode power supply (BPS).

FIG. 1 depicts an exemplary DC-DC conversion scenario illustrating a transient load response in exemplary modes of operation of a buck-derived switch-mode power supply (BPS). A transient load suppression example 100 includes one or more BPS circuits 105, which may be arranged, for example, in a multi-phase power supply system. The BPS circuit 105 is operably coupled to a buck-derived SMPS 110. The PBS circuit 105 may operate in several modes, controlled by an SMPS controller (not shown). For example, a constant on time constant average frequency operation of the BPS 105 may advantageously substantially minimize delay and/or settling time when a load demand 120 changes rapidly, for example, from a high load state 125 to a lower load state 130.

An output voltage supply 135 is supplied by the buck-derived SMPS 110. The output voltage supply 135 supplies various loads 140. The loads 140 may present transient current loading on the output voltage supply 135. As depicted in the exemplary load demand 120 chart, where constant on time operation is not implemented on the buck-derived SMPS 110, the output voltage response 145 may include substantially large perturbations in response to the transient current loading on the output voltage supply 135. When the BPS circuit 105 is implemented on the buck-derived SMPS 110 using an exemplary embodiment of constant on time operation, the output voltage response 150 is substantially well regulated, substantially avoiding the larger voltage perturbations.

In the depicted example, the buck-derived SMPS 110 is implemented in a computer 155. The computer 155 includes one or more buck-derived SMPSs 110 supplying one or more loads 140. In some examples, the loads 140 may be specified to operate at an input voltage with limited voltage perturbations.

Figure 2A:
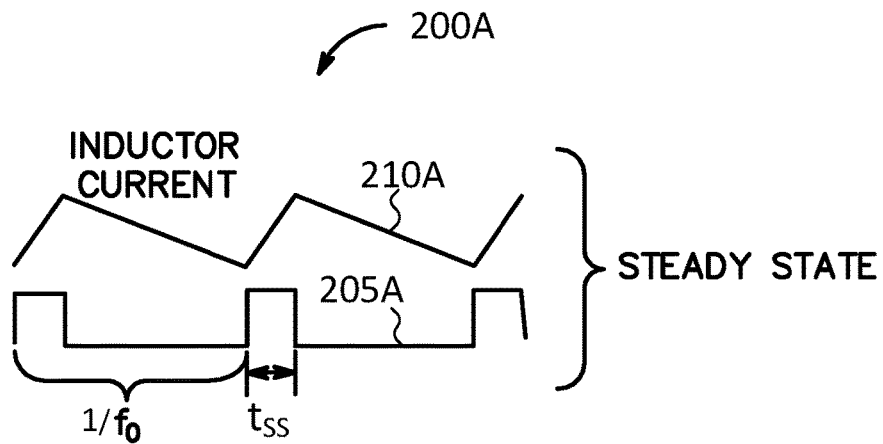
FIG. 2A depicts an exemplary simulated steady-state switching waveform of a constant on-time control switch-mode power supply.

FIG. 2A depicts an exemplary simulated steady-state switching waveform of a constant on-time control switch-mode power supply. A steady-state switching waveform 200A includes a waveform of a control signal 205A. The control signal 205A may be generated by a switch-mode controller (not shown). The control signal 205A may drive, for example, a high-side field-effect transistor (high-side FET) of a buck-derived SMPS. The steady-state switching waveform 200A includes a waveform of an inductor current 210A. In response to a constant on-time $t_{SS}$, the inductor current 210A ramps up. In response to an off-time the inductor current 210A ramps down. In the depicted example, the switching frequency is $f_O$.

Figure 2B:
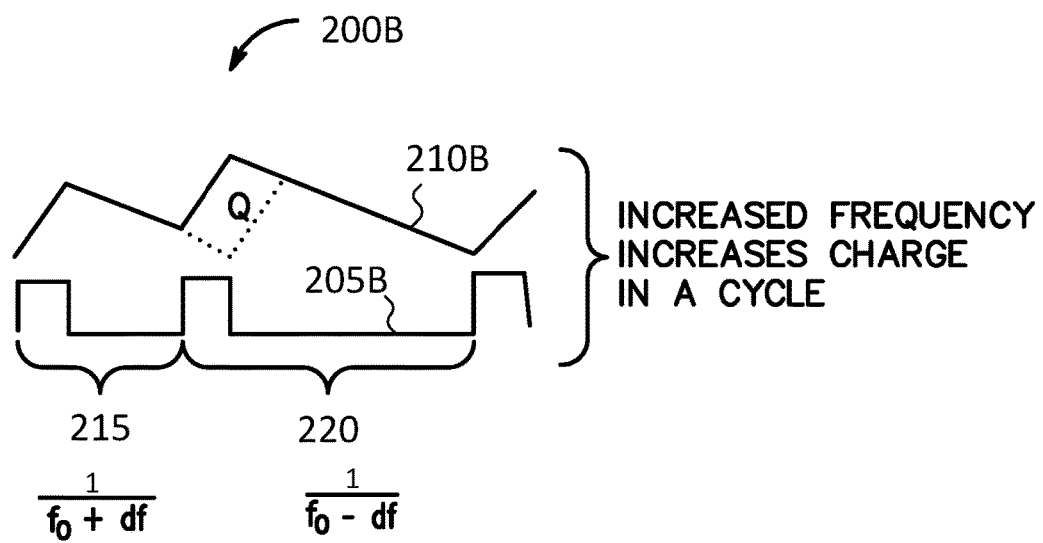
FIG. 2B depicts an exemplary simulated switching waveform of a constant on-time control switch-mode power supply responding to a transient load demand.

FIG. 2B depicts an exemplary simulated switching waveform of a constant on-time control switch-mode power supply responding to a transient load demand. A switching waveform 200B illustrates an exemplary operation of a constant on-time control circuit in response to a transient current load demand. An exemplary buck-derived constant on-time constant average frequency switch-mode power supply will be presented with reference to FIG. 4.

The switching waveform 200B includes a waveform of a control signal 205B. The steady-state switching waveform 200B includes a waveform of an inductor current 210B. In response to an increase in the current load demand, the switch-mode controller increases the frequency of the control signal 205B in a first cycle 215. In a second cycle 220, the switch-mode controller decreases the frequency of the control signal 205B, by an amount maintaining an average switching frequency over the two cycles 215, 220 approximately equal to the steady state average frequency. The increased frequency of the first cycle 215 provides an additional charge Q to an output inductor in the second cycle 220. The additional charge Q may provide a load with an additional current. The additional current may support an output voltage of the constant on-time control switch-mode power supply.

In some examples of larger increases in load demand, the switch-mode controller may increase the frequency of the control signal 205B in two or more cycles. Accordingly, the switch-mode controller decreases the frequency of the control signal 205B over one or more periods, by an amount maintaining the average switching frequency, relative to the steady state switching frequency, over the affected periods.

Figure 3A:
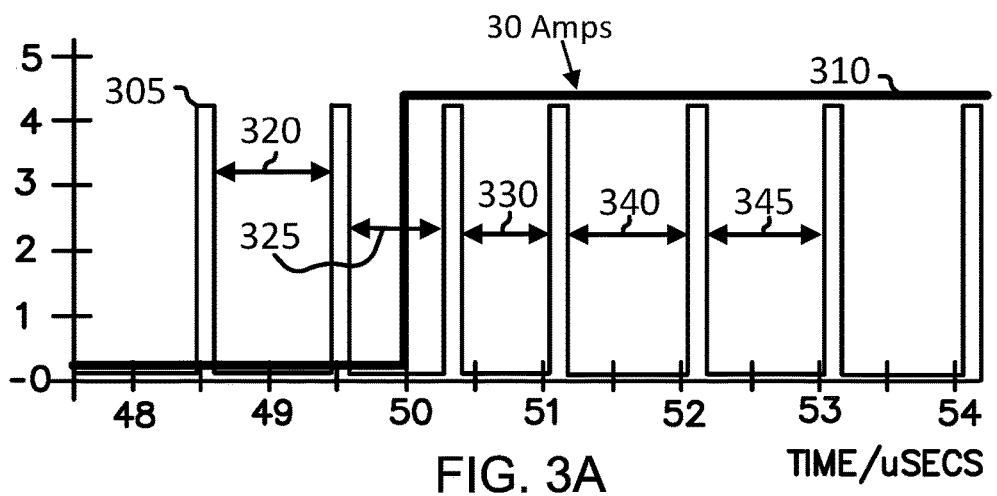
FIG. 3A depicts a chart view of a measured current load demand and an associated switching control signal response of an exemplary buck-derived constant on-time constant average frequency switch-mode power supply (BCOTCAFPS).

FIG. 3A depicts a chart view of a measured current load demand and an associated switching control signal response of an exemplary buck-derived constant on-time constant average frequency switch-mode power supply (BCOT-CAFPS). A BCOTCAFPS includes a switching signal 305. The switching signal 305 controls a high-side switching FET in the BCOTCAFPS. The switching signal 305 increases in frequency in response to a load current 310 making a step increase. In the depicted example, the load current 310 steps from a low current of about 1 Amp to a high current of about 30 A. The load current 310 is exemplary only, providing a load demand to illustrate an exemplary response of the BCOTCAFPS. In response to the step increase in the load current 310, the BCOTCAFPS increases the frequency of the switching signal 305 for one or more switching cycles.

Figure 3B:
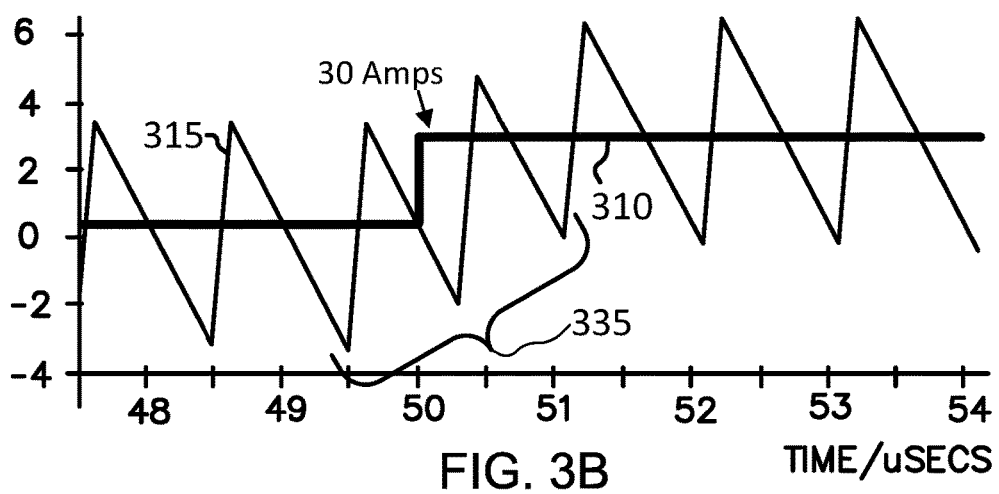
FIG. 3B depicts a chart view of a measured current load demand and an associated output inductor current response of an exemplary BCOTCAFPS.

FIG. 3B depicts a chart view of a measured current load demand and an associated output inductor current response of an exemplary BCOTCAFPS. FIG. 3B, may be measured in the same time instant as FIG. 3A, for example. The BCOTCAFPS exhibits normal buck-derived functionality as illustrated, for example, when the high-side FET turns on in response to the switching signal 305, an inductor current 315 in an output inductor ramps up.

Turning back to the depicted example in FIG. 3A, each on-time associated with the switching signal 305 is substantially equal. Accordingly, switching frequency changes may be a function of the off-time. A steady-state constant frequency is depicted and associated with a first steady-state off-time 320. As depicted, a step load change in load current 310 occurs at 50 uS. In response to the step load change, the switching frequency of the BCOTCAFPS increases as illustrated by a first reactionary off-time 325 and a second reactionary off-time 330. The reactionary off-times are shorter than the first steady-state off-time 320 in order to cause an average of the inductor current 315 to increase 335. Once the output load has been supplied with an additional charge by implementation of the increased frequency in the reactionary off-times 325, 330, then the switching frequency of the BCOTCAFPS decreases as illustrated by a post-reactionary off-time 340. The post-reactionary off-time 340 increases a corresponding amount, to maintain a substantially constant average switching frequency over the reactionary off-times 325, 330 and the post-reactionary off-time 340. Once the average frequency is achieved, a second steady-state off-time 345, is adjusted to be substantially equal to the first steady-state off-time 320.

In some examples, a BCOTCAFPS may produce one or more reactionary off-time periods. In some examples, a BCOTCAFPS may produce one or more post-reactionary off-time periods. The number of reactionary off-time periods and the number of post-reactionary off-time periods may be dependent on the magnitude and transition time of a step change of a load current, for example.

In some examples, a load current may step from a high current to a low current, for example in a load release. The reactionary off-time(s) in the load release may increase, for example, to reduce the average output current. An increase in the reactionary off-time(s) may correspond to decrease in switching frequency during the transient event. Accordingly, the post-reactionary switching frequency may increase, for example, to maintain the average switching frequency.

Figure 3C:
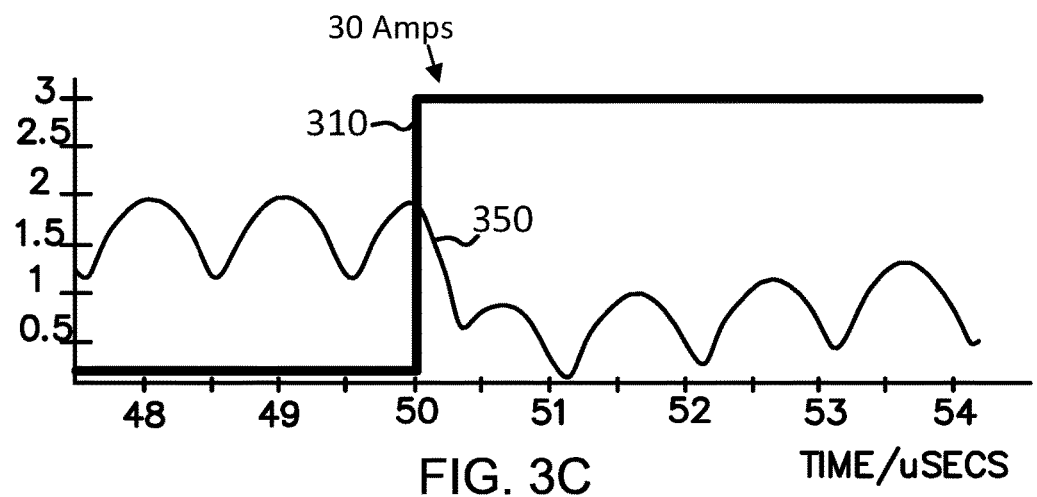
FIG. 3C depicts a chart view of a measured current load demand and an associated output voltage response of an exemplary BCOTCAFPS.

FIG. 3C depicts a chart view of a measured current load demand and an associated output voltage response of an exemplary BCOTCAFPS. Turning now to FIG. 3C, which may be measured in the same time instant as FIG. 3A and FIG. 3B, a resulting output voltage 350 measured in millivolts AC is depicted. At the step increase in the load current 310, the output voltage 350 immediately drops. As described in FIGS. 3A and 3B, the BCOTCAFPS increases the switching frequency and provides a corresponding charge increase in order to maintain a substantially load resistant output voltage regulation.

Figure 4:
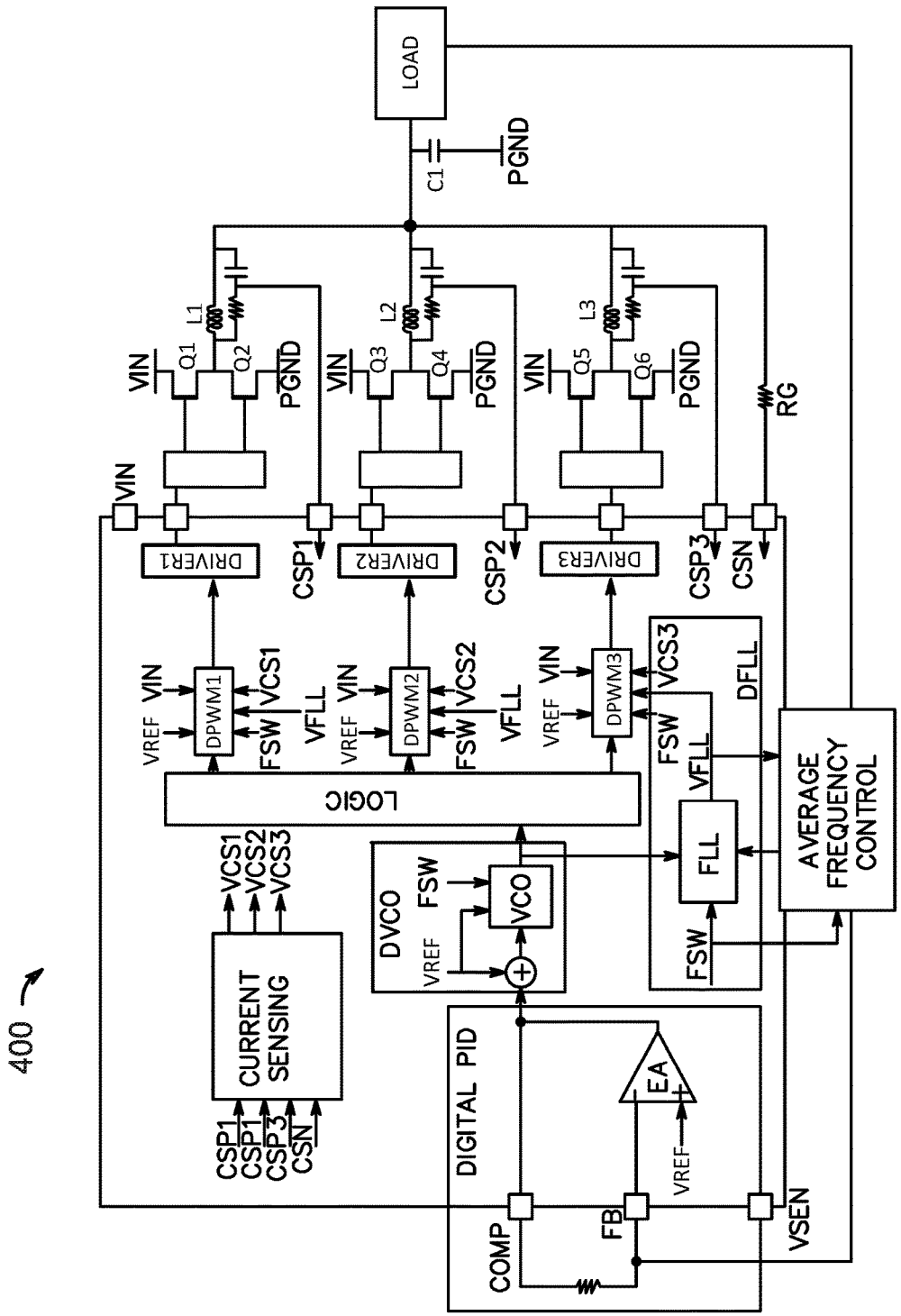
FIG. 4 depicts a schematic view of an exemplary BCOT-CAFPS implementation.

FIG. 4 depicts a schematic view of an exemplary BCOTCAFPS implementation. A BCOTCAFPS 400 includes multiple phases. A brief discussion of the concepts described with reference to FIGS. 2A-2B will be presented in the discussion of one of the phases of the exemplary BCOTCAFPS 400. The concept may be applied to the other phases.

The BCOTCAFPS 400 includes a first phase with an output inductor L1. The output inductor L1 is driven with a high-side FET Q1, and is facilitated with a low-side FET Q2 (e.g., freewheeling rectifier, synchronous rectifier). The output inductor L1 drives an output capacitor C1. The output capacitor C1 may be one or more capacitors lumped as one. The voltage across C1 is the output voltage. The load is represented by the load block.

The output voltage is monitored by the DIGITAL PID circuit, which includes an error amplifier EA. The output of the error amplifier EA provides the error voltage which feeds a digital voltage-controlled oscillator DVCO, which generates the switching frequency. The logic block then feeds the digital pulse width modulators DPWM1-3.

The switching frequency output of the DVCO feeds the digital frequency locked-loop DFLL. The DFLL monitors the switching frequency. The switching frequency is compared with the reference frequency and produces a resulting VFLL signal. The VFLL signal is fed into the DPWMs1-3. The DPWMs 1-3 are adjusted pulse-by-pulse in response to the VFLL, to regulate for constant average frequency.

Accordingly, the BCOTCAFPS 400 provides constant average frequency control. Constant average frequency control is accomplished by reading the period of one cycle, determining the deviation from a desired period (e.g., associated with a desired frequency) and compensating the next period by adding or subtracting off-time. The BCOTCAFPS 400 may force an equal and opposite period correction on the next cycle.

Figure 5:
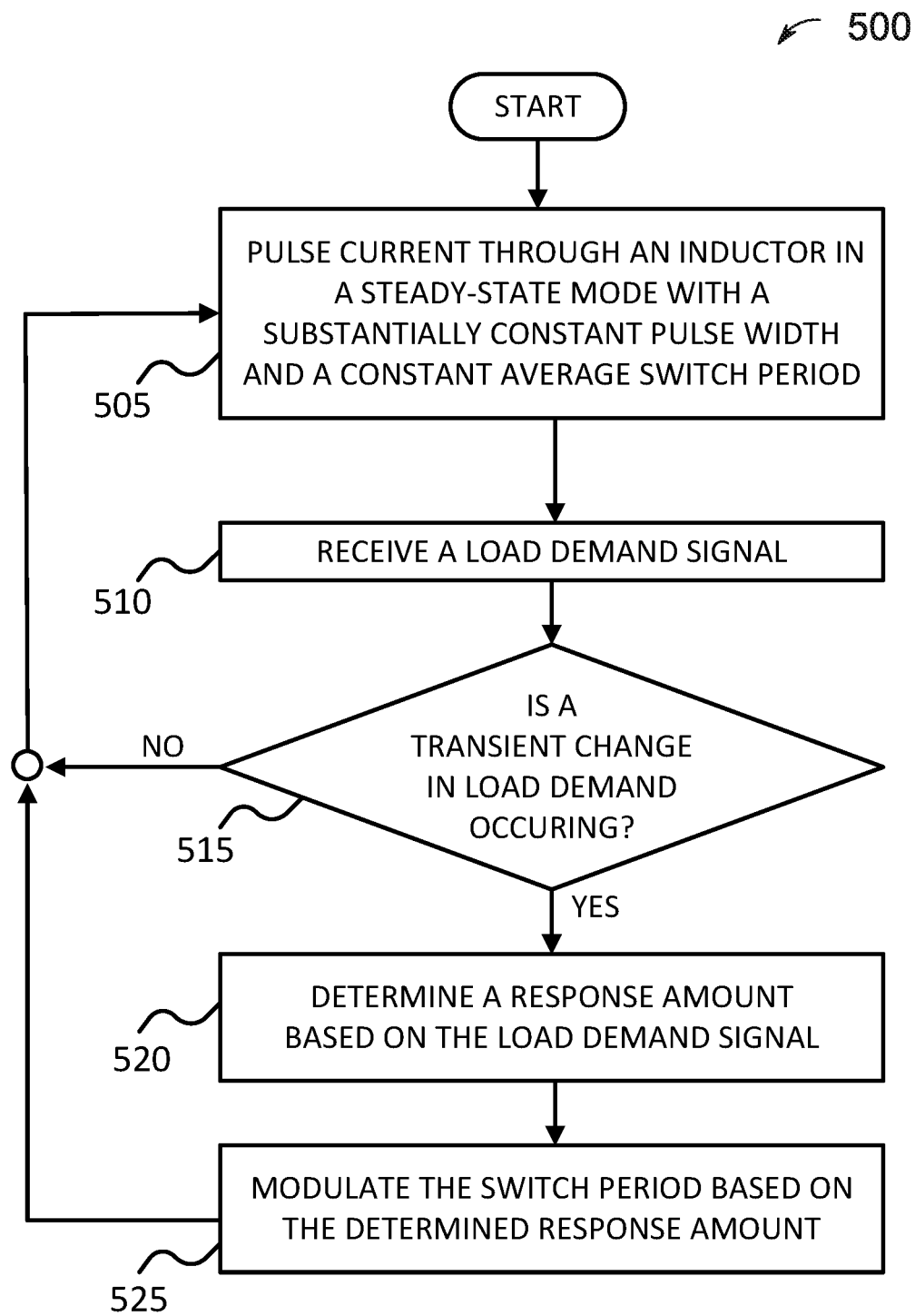
FIG. 5 depicts a flowchart view of an exemplary BCOT-CAFPS method.

FIG. 5 depicts a flowchart view of an exemplary BCOTCAFPS method. A BCOTCAFPS method 500 begins at a step 505. At step 505, a BCOTCAFPS controller pulses current through an inductor in a steady-state mode with a substantially constant pulse width and constant average switch period. Next at step 510, the BCOTCAFPS controller receives a load demand signal. The load demand signal may be produced by, for example, a current monitor on a BCOTCAFPS output. By way of example and not limitation, the current monitor may include a current sense resistor, a hall effect sensor, or a magnetic current sensor. Next at step 515, the BCOTCAFPS controller determines changes in the load demand. If a transient load demand is not occurring, then execution goes back to step 505. If a transient load demand is occurring, then execution continues to step 520, where the BCOTCAFPS controller determines a response amount based on a magnitude of the transient load demand. Next, at step 525, the BCOTCAFPS controller modulates a BCOTCAFPS switch period based on the determined response amount.

Although various embodiments have been described with reference to the figures, other embodiments are possible.

For example, a constant on-time controller may be configured according to one of more exemplary aspects. Various examples of freewheeling rectifiers may include synchronous rectifiers, Schottky diodes, high-speed rectifiers, general rectifiers and/or body diodes intrinsic within various transistors (e.g., FETs).

In an exemplary aspect, a power switch may be configured to pulse current through an inductor in a steady-state mode with a substantially constant pulse width and a constant average switch period, wherein in response to a detected transient change in load demand, a switch period may be modulated by an amount calculated to supply a change in additional energy demand in a first number of cycles. The switch period may be modulated by an amount calculated in a subsequent second number of cycles such that the average switch period is maintained over the first plus second number of cycles under dynamic load conditions.

Some aspects of embodiments may be implemented, in whole or in part, as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

In some embodiments, apparatus and associated methods may relate to a buck-derived switched mode power supply with constant on-time and configured to substantially maintain a steady-state average switch period in a time interval between a start of a load transient and the time when the inductor current returns to a steady state. In an illustrative example, the time interval may include a first and a second predetermined number of cycles after the start of the load transient. The switch period may be modulated, for example, by an amount calculated to supply a change in additional energy demand in the first number of cycles and an opposite amount in the subsequent second number of cycles calculated to maintain the average steady-state switch period over the time interval. In various examples, maintaining average switching period with constant on-time may minimize transient response times without sacrificing stability and without the need for complex compensation networks.

In some implementations, the inductor, the main switch and the freewheeling rectifier, taken alone or in combination, may be disposed within a housing or enclosure. In some implementations, the inductor may be implemented in an integrated circuit. In some embodiments, a discrete (e.g., wound wire) inductor may be packaged with one or more other components in a unitary object, such as by potting. For example, epoxy, elastomer, plastic or other suitable conformable materials may bind or encase the components into a single packaged object. In various implementations, by way of example and not limitation, a housing or enclosure may be formed by dipping, potting, spraying, electrostatic operation, or injection molding.

In an exemplary aspect, a buck-derived switched mode power supply apparatus includes a main switch operative to selectively connect a first terminal of an input voltage source to an intermediate switch node, an inductor coupled to the intermediate switch node and an output terminal configured to couple to a load, and a freewheeling rectifier coupled to circulate inductor current returning from the load back to the intermediate switch node. The apparatus further includes a processor operably coupled to control a conductivity state of the main switch; and, a data store operably coupled to the processor and containing a program of instructions that, when executed by the processor, cause the processor to perform operations to substantially maintain an average period for the main switch. The operations include: (a) determine the on-time and switching cycle period during a period of the main switch control signal at the start of a load transient; (b) determine a first off-time adjustment that, when applied to the main switch, is effective to deliver the additional amount of energy demanded by the load transient; (c) during the first portion of a response time interval that begins with a start of a load transient and ends when the inductor current returns to a steady state, adjust the main switch off time according to the first off-time adjustment; (d) determine a second off-time adjustment that, when applied to the main switch during a second portion of the response time that comprises a remainder of the response time interval, is effective to maintain the average period for the main switch during the response time interval equal to the determined period at the start of the load transient; (e) during the second portion of the response time interval, adjust the main switch off time according to the second off-time adjustment; and, (f) maintain the determined on-time for the main switch during the response time interval.

In various examples of the apparatus, the second off-time adjustment may have equal magnitude and opposite sign relative to the first off-time adjustment. In some cases, the second off-time adjustment may have a different magnitude and opposite sign relative to the first off-time adjustment. The operation to determine the first off time adjustment may further include: determine the offset to supply the change in additional energy demand in a first predetermined number of switching cycles. The operation to determine the second off time adjustment may further include determining the offset effective to maintain the average period within a second predetermined number of switching cycles. The operations may also determine both and have equal first and second numbers of predetermined switching cycles. The first or second predetermined number of switching cycles may be, for example, as little as one, but could also be, by way of example and not limitation, two, three, or less than 10.

In another exemplary aspect, a buck-derived switched mode power supply controller apparatus may include a controller. The controller module may include a processor and a memory device (e.g., data store). The processor may be adapted to operatively couple to at least one phase of a buck-derived power supply (BDPS), each of the at least one BDPS comprises a main switch, an inductor, and a freewheeling rectifier, wherein the processor is operably coupled to control a conductivity state of the main switch. The data store may be operably coupled to the processor and containing a program of instructions that, when executed by the processor, cause the processor to perform operations to substantially maintain an average period for the main switch. The operations may include: (a) determine the on-time and switching cycle period during a period of the main switch control signal at the start of a load transient; (b) determine a first off-time adjustment that, when applied to the main switch, is effective to deliver the additional amount of energy demanded by the load transient; (c) during the first portion of a response time interval that begins with a start of a load transient and ends when the inductor current returns to a steady state, adjust the main switch off time according to the first off-time adjustment; (d) determine a second off-time adjustment that, when applied to the main switch during a second portion of the response time that comprises a remainder of the response time interval, is effective to maintain the average period for the main switch during the response time interval equal to the determined period at the start of the load transient; (e) during the second portion of the response time interval, adjust the main switch off time according to the second off-time adjustment; and, (f) maintain the determined on-time for the main switch during the response time interval.

The freewheeling rectifier may be, for example, a synchronous rectifier operably controlled by the processor.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A buck-derived switched mode power supply, the apparatus comprising:
   a main switch operative to selectively connect a first terminal of an input voltage source to an intermediate switch node;
   an inductor coupled to the intermediate switch node and an output terminal configured to couple to a load;
   a rectifier coupled to circulate inductor current returning from the load back to the intermediate switch node;
   a processor operably coupled to control a conductivity state of the main switch; and,
   a data store operably coupled to the processor and containing a program of instructions that, when executed by the processor, cause the processor to perform operations to substantially maintain an average period for the main switch, the operations comprising:
   determine the on-time and switching cycle period during a period of the main switch control signal at the start of a load transient;
   determine a first off-time adjustment that, when applied to the main switch, is effective to deliver the additional amount of energy demanded by the load transient;
   during the first portion of a response time interval that begins with a start of a load transient and ends when the inductor current returns to a steady state, adjust the main switch off time according to the first off-time adjustment;
   determine a second off-time adjustment that, when applied to the main switch during a second portion of the response time that comprises a remainder of the response time interval, is effective to maintain the average period for the main switch during the response time interval equal to the determined period at the start of the load transient;
   during the second portion of the response time interval, adjust the main switch off time according to the second off-time adjustment; and,
   maintain the determined on-time for the main switch during the response time interval.

2. The apparatus of claim 1, wherein the second off-time adjustment has equal magnitude and opposite sign relative to the first off-time adjustment.

3. The apparatus of claim 1, wherein the second off-time adjustment has a different magnitude and opposite sign relative to the first off-time adjustment.

4. The apparatus of claim 1, wherein the operation to determine the first off time adjustment further comprises determining the offset to supply the change in additional energy demand in a first predetermined number of switching cycles.

5. The apparatus of claim 1, wherein the operation to determine the second off time adjustment further comprises determining the offset effective to maintain the average period within a second predetermined number of switching cycles.

6. The apparatus of claim 1, wherein the operation to determine the first off time adjustment further comprises determining the offset to supply the change in additional energy demand in a first predetermined number of switching cycles, the operation to determine the second off time adjustment further comprises determining the offset effective to maintain the average period within a second predetermined number of switching cycles, and the first and second number of predetermined switching cycles are equal.

7. The apparatus of claim 4, wherein the first predetermined number of switching cycles is one.

8. The apparatus of claim 4, wherein the first predetermined number of switching cycles is two.

9. The apparatus of claim 4, wherein the first predetermined number of switching cycles is less than 10.

10. A buck-derived switched mode power supply controller, the apparatus comprising:
    a controller comprising:
    (a) a processor adapted to operatively couple to at least one phase of a buck-derived power supply (BDPS), each of the at least one BDPS comprises a main switch, an inductor, and a rectifier, wherein the processor is operably coupled to control a conductivity state of the main switch; and,
    (b) a data store operably coupled to the processor and containing a program of instructions that, when executed by the processor, cause the processor to perform operations to substantially maintain an average period for the main switch, the operations comprising:
    determine the on-time and switching cycle period during a period of the main switch control signal at the start of a load transient;
    determine a first off-time adjustment that, when applied to the main switch, is effective to deliver the additional amount of energy demanded by the load transient;
    during the first portion of a response time interval that begins with a start of a load transient and ends when the inductor current returns to a steady state, adjust the main switch off time according to the first off-time adjustment;
    determine a second off-time adjustment that, when applied to the main switch during a second portion of the response time that comprises a remainder of the response time interval, is effective to maintain the average period for the main switch during the response time interval equal to the determined period at the start of the load transient;
    during the second portion of the response time interval, adjust the main switch off time according to the second off-time adjustment; and,
    maintain the determined on-time for the main switch during the response time interval.

11. The apparatus of claim 10, wherein the second off-time adjustment has equal magnitude and opposite sign relative to the first off-time adjustment.

12. The apparatus of claim 10, wherein the second off-time adjustment has a different magnitude and opposite sign relative to the first off-time adjustment.

13. The apparatus of claim 10, wherein the operation to determine the first off time adjustment further comprises determining the offset to supply the change in additional energy demand in a first predetermined number of switching cycles, the operation to determine the second off time adjustment further comprises determining the offset effective to maintain the average period within a second predetermined number of switching cycles, and the first and second number of predetermined switching cycles are equal.

14. The apparatus of claim 10, wherein the operation to determine the first off time adjustment further comprises determining the offset to supply the change in additional energy demand in a first predetermined number of switching cycles.

15. The apparatus of claim 10, wherein the operation to determine the second off time adjustment further comprises determining the offset effective to maintain the average period within a second predetermined number of switching cycles.

16. The apparatus of claim 13, wherein the first predetermined number of switching cycles is one.

17. The apparatus of claim 13, wherein the first predetermined number of switching cycles is two.

18. The apparatus of claim 13, wherein the first predetermined number of switching cycles is three.

19. The apparatus of claim 13, wherein the first predetermined number of switching cycles is less than 10.

20. The apparatus of claim 10, wherein the freewheeling rectifier comprises a synchronous rectifier operably controlled by the processor.

* * * * *